US009299917B2

(12) United States Patent
Friedman et al.

(10) Patent No.: US 9,299,917 B2
(45) Date of Patent: Mar. 29, 2016

(54) MAGNETIC TUNNEL JUNCTIONS WITH CONTROL WIRE

(71) Applicant: Northwestern University, Evanston, IL (US)

(72) Inventors: Joseph Shimon Friedman, Paris (FR); Alan V. Sahakian, Northbrook, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 14/494,813

(22) Filed: Sep. 24, 2014

(65) Prior Publication Data

US 2015/0091111 A1 Apr. 2, 2015

Related U.S. Application Data

(60) Provisional application No. 61/884,262, filed on Sep. 30, 2013.

(51) Int. Cl.
| | |
|---|---|
| *H01L 43/02* | (2006.01) |
| *H01L 29/82* | (2006.01) |
| *H01L 27/22* | (2006.01) |
| *H01L 43/08* | (2006.01) |
| *H03K 19/18* | (2006.01) |

(52) U.S. Cl.
CPC ............... *H01L 43/02* (2013.01); *H01L 27/22* (2013.01); *H01L 29/82* (2013.01); *H01L 43/08* (2013.01); *H03K 19/18* (2013.01)

(58) Field of Classification Search
CPC ......... H01L 43/02; H01L 29/82; H01L 43/08; H01L 27/22; H03K 19/18

USPC ........................................................ 257/421
See application file for complete search history.

(56) References Cited

U.S. PATENT DOCUMENTS

| | | | | |
|---|---|---|---|---|
| 5,640,343 | A | 6/1997 | Gallagher et al. | |
| 6,845,038 | B1 * | 1/2005 | Shukh ........................... | 365/171 |
| 2002/0167059 | A1 * | 11/2002 | Nishimura et al. ........... | 257/421 |
| 2005/0018478 | A1 * | 1/2005 | Nagase .................. | G11C 11/16 365/171 |
| 2009/0243607 | A1 * | 10/2009 | Mather .................. | B82Y 25/00 324/249 |
| 2010/0073984 | A1 * | 3/2010 | Xi et al. .......................... | 365/80 |
| 2013/0063178 | A1 | 3/2013 | Friedman et al. | |

OTHER PUBLICATIONS

Bromberg et al., Novel STT-MTJ Device Enabling All-Metallic Logic Circuits, IEEE Transactions on Magnetics, vol. 48, No. 11, Nov. 2012, pp. 3215-3218.

(Continued)

*Primary Examiner* — Howard Weiss
*Assistant Examiner* — Sue Tang
(74) *Attorney, Agent, or Firm* — Bell & Manning, LLC

(57) ABSTRACT

A magnetic tunnel junction (MTJ) device is provided that includes a MTJ element and a control wire. The MTJ element includes a top ferromagnet layer formed of a first magnetic material, a tunneling layer, and a bottom ferromagnet layer formed of a second magnetic material. The tunneling layer is mounted between the top ferromagnet layer and the bottom ferromagnet layer. The control wire is configured to conduct a charge pulse. A direction of charge flow in the control wire extends substantially perpendicular to a magnetization direction of the top ferromagnet layer. The control wire is positioned sufficiently close to the top ferromagnet layer to reverse the magnetization direction of the top ferromagnet layer when the charge pulse flows therethrough while not reversing the magnetization direction of the bottom ferromagnet layer when the charge pulse flows therethrough.

19 Claims, 7 Drawing Sheets

(56) References Cited

OTHER PUBLICATIONS

Calayir et al., All-Magnetic Analog Associative Memory, 2013 IEEE 11th International New Circuits and Systems Conference (NEWCAS), Jun. 16, 2013, pp. 1-4.

Ikeda et al., Tunnel magnetoresistance of 604% at 300 K by suppression of Ta diffusion in CoFeB / MgO / CoFeB pseudo-spin-valves annealed at high temperature, Appl. Phys. Lett., vol. 93, Aug. 29, 2008, pp. 082508-1-082508-3.

* cited by examiner

| Logic Function | Number of Devices | | Number of Stages | |
| --- | --- | --- | --- | --- |
| | CMOS | MJT 100 | CMOS | MJT 100 |
| NAND | 4 | 4 | 1 | 1 |
| AND | 6 | 4 | 2 | 1 |
| NOR | 4 | 4 | 1 | 1 |
| OR | 6 | 4 | 2 | 1 |
| XNOR | 12 | 6 | 2 | 1 |
| XOR | 12 | 6 | 2 | 1 |
| 2:1 MUX | 12 | 6 | 3 | 1 |
| Half Adder | 14 | 10 | 2 | 1 |
| Full Adder | 28 | 24 | 2-Carry, 3-Sum | 1 |

Fig. 7

MAGNETIC TUNNEL JUNCTIONS WITH CONTROL WIRE

CROSS-REFERENCE TO RELATED APPLICATIONS

The present application claims priority to U.S. Provisional Patent Application No. 61/884,262 that was filed Sep. 30, 2013, the entire contents of which is hereby incorporated by reference.

BACKGROUND

The application of spintronic technologies to general-purpose computing has been impeded by the difficulty in satisfying fundamental computing requirements. While the speed, power, and area of a logic gate are important, it is further important that the logical devices be connected in an efficient fashion such that the inputs and outputs of a logic gate are of such a form that the output of one gate can be used directly as the input of another gate without additional circuit elements; that is, the gates can be cascaded directly. Many proposed spintronic logic families do not permit direct cascading of logic gates, necessitating some combination of additional amplification, control logic, and logic execution stages. These processes require additional circuit elements such as complementary metal-oxide semiconductor transistors that consume significant power, processing time, and area, undermining the gains resulting from the use of spintronic technologies.

SUMMARY

In an illustrative embodiment, a magnetic tunnel junction device is provided. The magnetic tunnel junction device includes, but is not limited to, a MTJ element and a control wire. The MTJ element includes, but is not limited to, a top ferromagnet layer formed of a first magnetic material, a tunneling layer, and a bottom ferromagnet layer formed of a second magnetic material. The tunneling layer is mounted between the top ferromagnet layer and the bottom ferromagnet layer. The control wire is configured to conduct a charge pulse. A direction of charge flow in the control wire extends substantially perpendicular to a magnetization direction of the top ferromagnet layer. The control wire is positioned sufficiently close to the top ferromagnet layer to reverse the magnetization direction of the top ferromagnet layer when the charge pulse flows therethrough while not reversing the magnetization direction of the bottom ferromagnet layer when the charge pulse flows therethrough.

In another illustrative embodiment, magnetic tunnel junction device is provided. The magnetic tunnel junction device includes, but is not limited to, a first MTJ element, a second MTJ element, and a control wire. The first MTJ element includes, but is not limited to, a first top ferromagnet layer formed of a first magnetic material, a first tunneling layer, and a bottom ferromagnet layer formed of a second magnetic material. The first tunneling layer is mounted between the first top ferromagnet layer and the bottom ferromagnet layer. The second MTJ element includes, but is not limited to, a second top ferromagnet layer formed of the first magnetic material, a second tunneling layer, and the bottom ferromagnet layer. The second tunneling layer is mounted between the second top ferromagnet layer and the bottom ferromagnet layer. The control wire is configured to conduct a charge pulse. A direction of charge flow in the control wire extends substantially perpendicular to a magnetization direction of the first top ferromagnet layer and of the second top ferromagnet layer. The direction of charge flow in the control wire extends between the first top ferromagnet layer and the second top ferromagnet layer. The control wire is positioned sufficiently close to the first top ferromagnet layer and to the second top ferromagnet layer to reverse the magnetization direction of the first top ferromagnet layer and of the second top ferromagnet layer when the charge pulse flows therethrough while not reversing the magnetization direction of the bottom ferromagnet layer when the charge pulse flows therethrough.

Other principal features of the disclosed subject matter will become apparent to those skilled in the art upon review of the following drawings, the detailed description, and the appended claims.

BRIEF DESCRIPTION OF THE DRAWINGS

Illustrative embodiments of the disclosed subject matter will hereafter be described referring to the accompanying drawings, wherein like numerals denote like elements.

FIG. 7 is a table showing a comparison between logic circuits implemented using a complementary metal-oxide semiconductor based structure and using the magnetic tunnel junction device of FIG. 1 in accordance with an illustrative embodiment.

DETAILED DESCRIPTION

Figure 1:
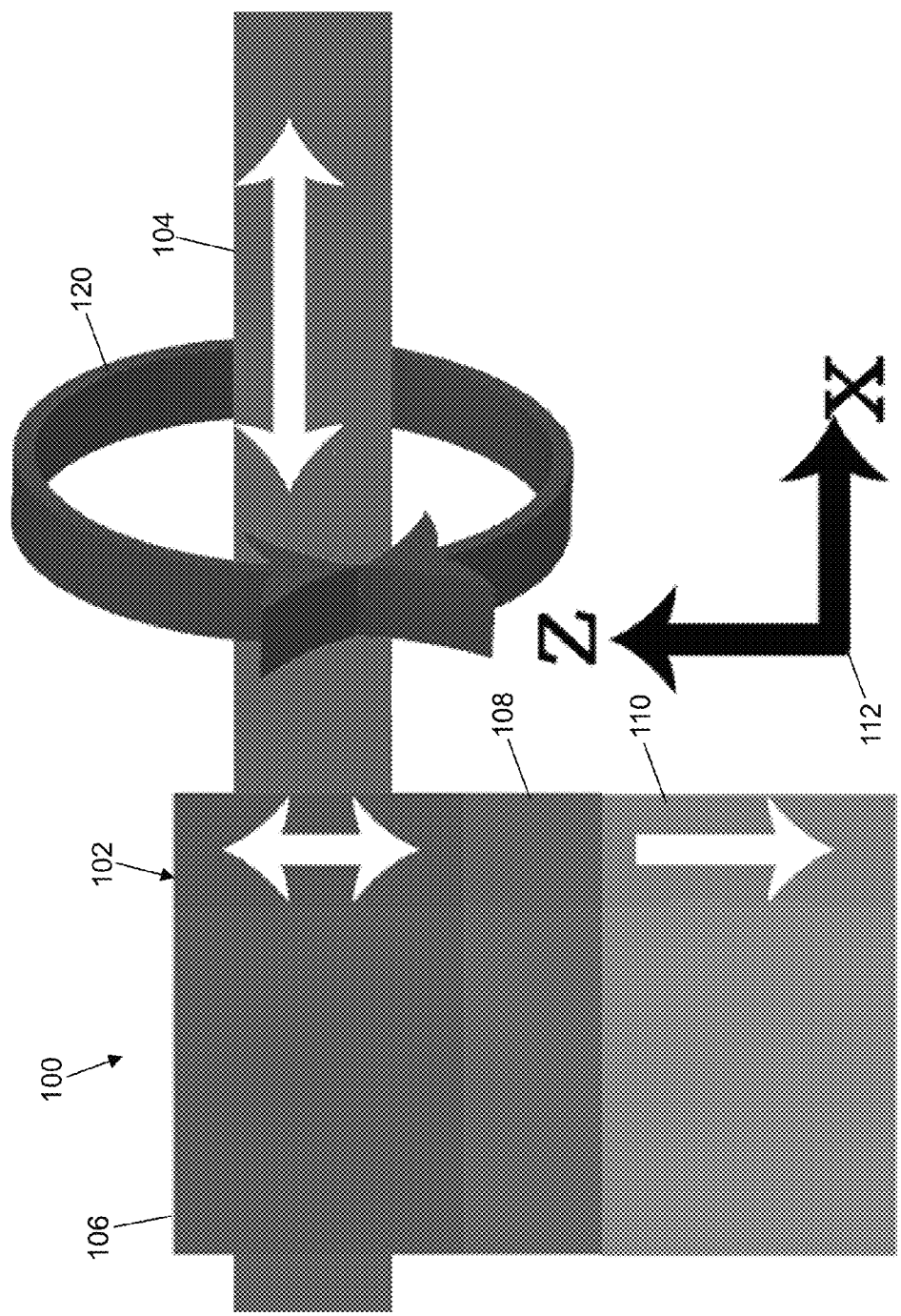
FIG. 1 depicts a schematic side view of a magnetic tunnel junction device in accordance with an illustrative embodiment.

With reference to FIG. 1, a schematic side view of a magnetic tunnel junction (MTJ) device 100 is shown in accordance with an illustrative embodiment. MTJ device 100 may include a MTJ element 102 and a control wire 104. MTJ element 102 may include a top ferromagnet layer 106, a tunneling layer 108, and a bottom ferromagnet layer 110. Tunneling layer 108 is mounted between top ferromagnet layer 106 and bottom ferromagnet layer 110.

As understood by a person of skill in the art, tunneling layer 108 forms an insulating layer that is thin enough (typically a few nanometers) to allow electrons to tunnel from top ferromagnet layer 106 to bottom ferromagnet layer 110 or vice versa. MTJ element 102 can be formed using a variety of thin film technologies as understood by a person of skill in the art.

Tunneling layer 108 acts as a tunnel barrier. A tunneling probability through tunneling layer 108 is determined by the orientation of the ferromagnet polarization of top ferromagnet layer 106 and bottom ferromagnet layer 110. When top ferromagnet layer 106 and bottom ferromagnet layer 110 have polarizations that are parallel and in the same direction, there is a higher probability of electron tunneling between top ferromagnet layer 106 and bottom ferromagnet layer 110 through tunneling layer 108. When top ferromagnet layer 106 and bottom ferromagnet layer 110 have polarizations that are parallel, but in opposite directions (anti-parallel), there is a lower probability of electron tunneling between top ferromagnet layer 106 and bottom ferromagnet layer 110 through tunneling layer 108. Large resistance ratios between the parallel and anti-parallel states are achievable. For example, magnetoresistance ratios greater than seven have been demonstrated at room temperature (See S. Ikeda, et al., "Tunnel magnetoresistance of 604% at 300 K by suppression of Ta diffusion in CoFeB/MgO/CoFeB pseudo-spin-valves annealed at high temperature," Appl. Phys. Lett., vol. 93, pp. 082508, August 2008.). Higher ratios may be possible.

The magnetization direction of top ferromagnet layer 106 and bottom ferromagnet layer 110 can be switched with an external magnetic field. The required strength and duration of the magnetic field is determined by the material properties of top ferromagnet layer 106 and bottom ferromagnet layer 110. Top ferromagnet layer 106 is formed of a "soft" ferromagnetic material relative to the ferromagnetic material used to form bottom ferromagnet layer 110 such that a stronger magnetic field is applied to switch the magnetic polarization direction of bottom ferromagnet layer 110 than is applied to switch the magnetic polarization direction of top ferromagnet layer 106.

The magnetization of the "hard" magnetic material used to form bottom ferromagnet layer 110 is constant and in a −z direction as shown with reference to an x-z coordinate reference frame 112. The magnetization of the "soft" magnetic material used to form top ferromagnet layer 106 is selectable between a ±z direction based on application of a current through control wire 104. As a result, the respective magnetic materials used to form top ferromagnet layer 106 and bottom ferromagnet layer 110 are selected to achieve the relative difference in magnetic field that switches the magnetic polarization direction of top ferromagnet layer 106 without changing the magnetic polarization direction of bottom ferromagnet layer 110. Additionally, the relative dimensions between top ferromagnet layer 106 and bottom ferromagnet layer 110 may be selected to further achieve the relative difference in magnetic field applied to switch the magnetic polarization direction of top ferromagnet layer 106 without changing the magnetic polarization direction of bottom ferromagnet layer 110. Still further, the relative positioning between top ferromagnet layer 106 and bottom ferromagnet layer 110 may be selected to further achieve the relative difference in magnetic field applied to switch the magnetic polarization direction of top ferromagnet layer 106 without changing the magnetic polarization direction of bottom ferromagnet layer 110 by control wire 104. Merely for illustration, top ferromagnet layer 106, tunneling layer 108, and bottom ferromagnet layer 110 may be formed of CoFeB/MgO/CoFeB, respectively.

Control wire 104 is positioned adjacent to top ferromagnet layer 106 to extend in a ±x direction as shown with reference to x-z coordinate reference frame 112. Charge pulses flow through control wire 104 to create a magnetic field 120 that can switch the magnetization direction of top ferromagnet layer 106. If a charge pulse flows in the +x direction, the magnetization direction of top ferromagnet layer 106 is forced to the −z direction, parallel to the magnetization direction of bottom ferromagnet layer 110. MTJ element 102 enters its low resistance state because electrons can easily flow across tunneling layer 108. If a charge pulse flows through control wire 104 in the −x direction, the magnetization direction of top ferromagnet layer 106 is forced to the +z direction, anti-parallel to the magnetization direction of bottom ferromagnet layer 110. MTJ element 102 enters its high resistance state because electrons cannot easily flow across tunneling layer 108. The ferromagnetic materials used to form top ferromagnet layer 106 and bottom ferromagnet layer 110 may be selected to be non-volatile and to maintain the orientation of their magnetization when no external magnetic field is applied.

Control wire 104 may be formed of a variety of conductive materials and to have a variety of shapes and sizes that may be selected to induce a magnetic field when a charge pulse flows therethrough that is sufficient to switch the magnetization direction of top ferromagnet layer 106. Control wire 104 is further positioned sufficiently close to top ferromagnet layer 106 to switch the magnetization direction of top ferromagnet layer 106 when the charge pulse flows therethrough. Control wire 104 may be connected to a constant voltage node and a variable voltage node such that the charge pulse can be switched for transmission in the +x direction, the −x direction, or off.

Figure 2:
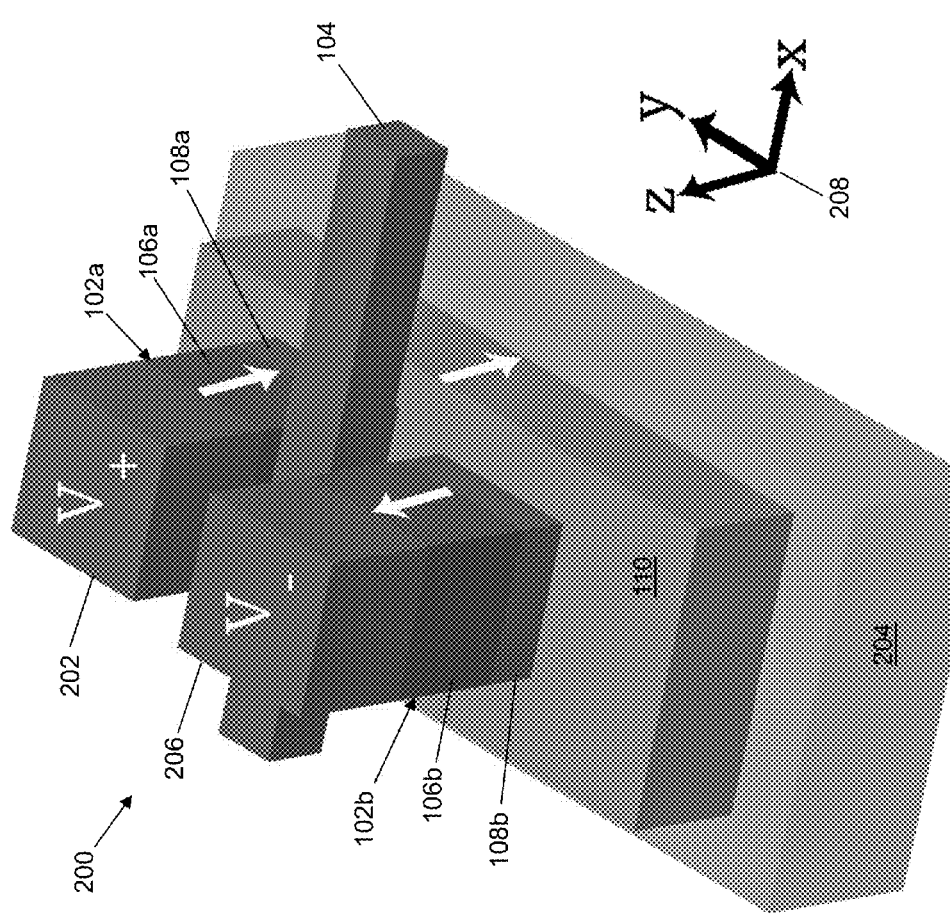
FIG. 2 depicts a schematic perspective view of an inverter formed using the magnetic tunnel junction device of FIG. 1 in accordance with an illustrative embodiment.

With reference to FIG. 2, a schematic perspective view of an inverter device 200 is shown in accordance with an illustrative embodiment. Inverter device 200 may include a first MTJ element 102a, a second MTJ element 102b, and control wire 104. First MTJ element 102a may include a first top ferromagnet layer 106a, a first tunneling layer 108a, and bottom ferromagnet layer 110. Second MTJ element 102b may include a second top ferromagnet layer 106b, a second tunneling layer 108b, and bottom ferromagnet layer 110. First top ferromagnet layer 106a and second top ferromagnet layer 106b are similar to top ferromagnet layer 106 described with reference to MTJ element 102. First tunneling layer 108a and second tunneling layer 108b are similar to tunneling layer 108 described with reference to MTJ element 102. First tunneling layer 108a is mounted between first top ferromagnet layer 106a and bottom ferromagnet layer 110. Second tunneling layer 108b is mounted between second top ferromagnet layer 106b and bottom ferromagnet layer 110.

Inverter device 200 further may include a first electrode 202, a substrate 204, and a second electrode 206. First electrode 202 is formed on first top ferromagnet layer 106a such that first top ferromagnet layer 106a is positioned between first electrode 202 and first tunneling layer 108a. First electrode 202 is formed of a conductive material such as a metal.

Bottom ferromagnet layer 110 is formed on substrate 204. Substrate 204 may be formed of a material such as silicon though other substrate materials may be used as understood by a person of skill in the art.

Second electrode 206 is formed on second top ferromagnet layer 106b such that second top ferromagnet layer 106b is positioned between second electrode 206 and second tunneling layer 108b. Second electrode 206 is formed of a conductive material such as a metal.

Again, the magnetization of the "hard" magnetic material used to form bottom ferromagnet layer 110 is constant and in a −z direction as shown with reference to an x-y-z coordinate reference frame 208. The magnetization of the "soft" magnetic material used to form first top ferromagnet layer 106a and second top ferromagnet layer 106b is selectable between a ±z direction based on application of a current through control wire 104. Control wire 104 is positioned sufficiently close to first top ferromagnet layer 106a and to second top ferromagnet layer 106b to switch the magnetization direction of first top ferromagnet layer 106a and/or second top ferromagnet layer 106b when a charge pulse flows through control wire 104.

Figure 3:
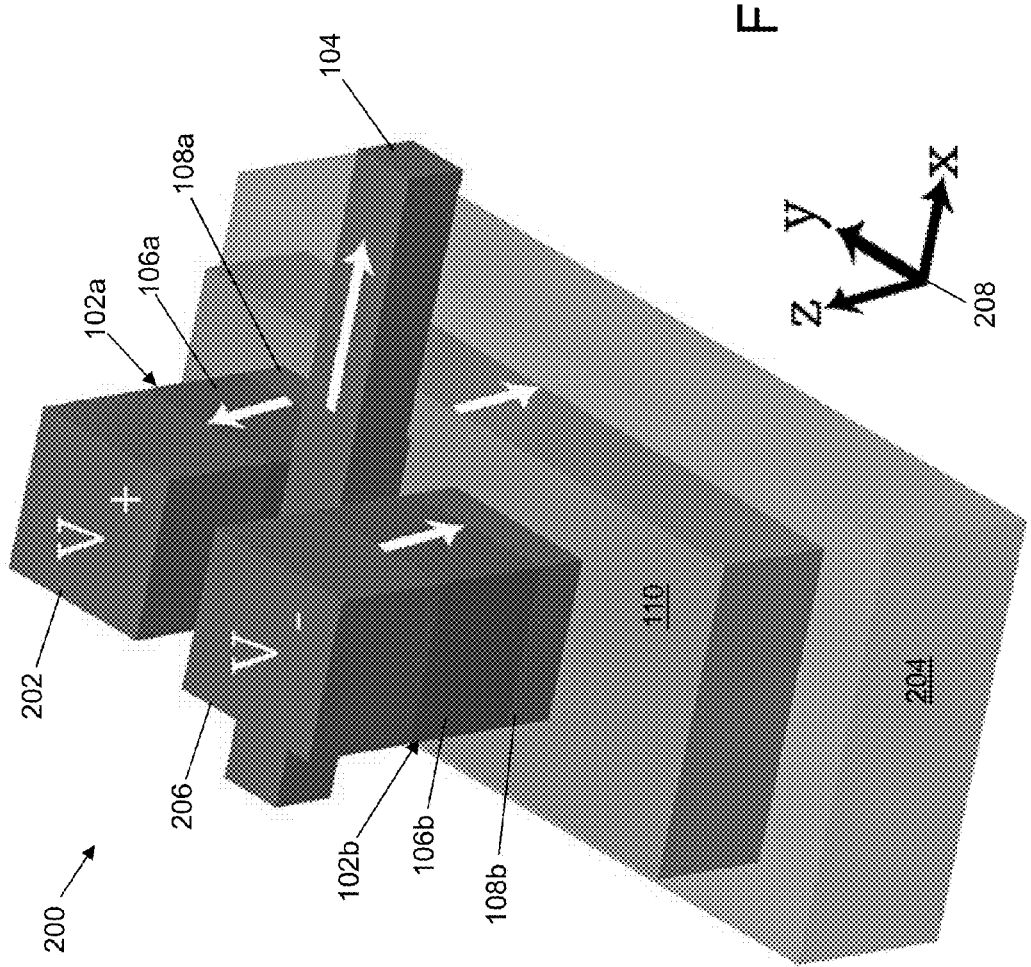
FIG. 3 depicts a schematic perspective view of the inverter of FIG. 2 after a charge pulse flows through a control wire of the magnetic tunnel junction device in accordance with an illustrative embodiment.

To act as an inverter, inverter device 200 outputs a signal opposite that of its input. In an initial state, first MTJ element 102a is in its parallel state with first top ferromagnet layer 106a switched to the −z direction. Second MTJ element 102b is in its antiparallel state with second top ferromagnet layer 106b switched to the +z direction. An output node connected to bottom ferromagnet layer 110 has an electric potential equal to a first electric potential applied to first electrode 202. When a charge pulse flows through control wire 104 in the +x direction, the magnetization of first top ferromagnet layer 106a is switched to the +z direction and the magnetization of second top ferromagnet layer 106b is switched to the −z direction, as shown in FIG. 3, causing the output node connected to bottom ferromagnet layer 110 to have an electric potential equal to a second electric potential applied to second electrode 206. In an illustrative embodiment, the second potential is less than the first potential causing electrons to flow through second MTJ element 102b from second electrode 206 to bottom ferromagnet layer 110.

Direct cascading of logic gates can be achieved by using this electron current flow as an input charge pulse to other logic gates. By forming a capacitor with an insulating dielectric between bottom ferromagnet layer 110 and an input control wire, a charge pulse flows through the input control wire whenever the voltage on bottom ferromagnet layer 110 switches. The input control wire can be connected to drive other logic gates or as a logical output.

Figure 4:
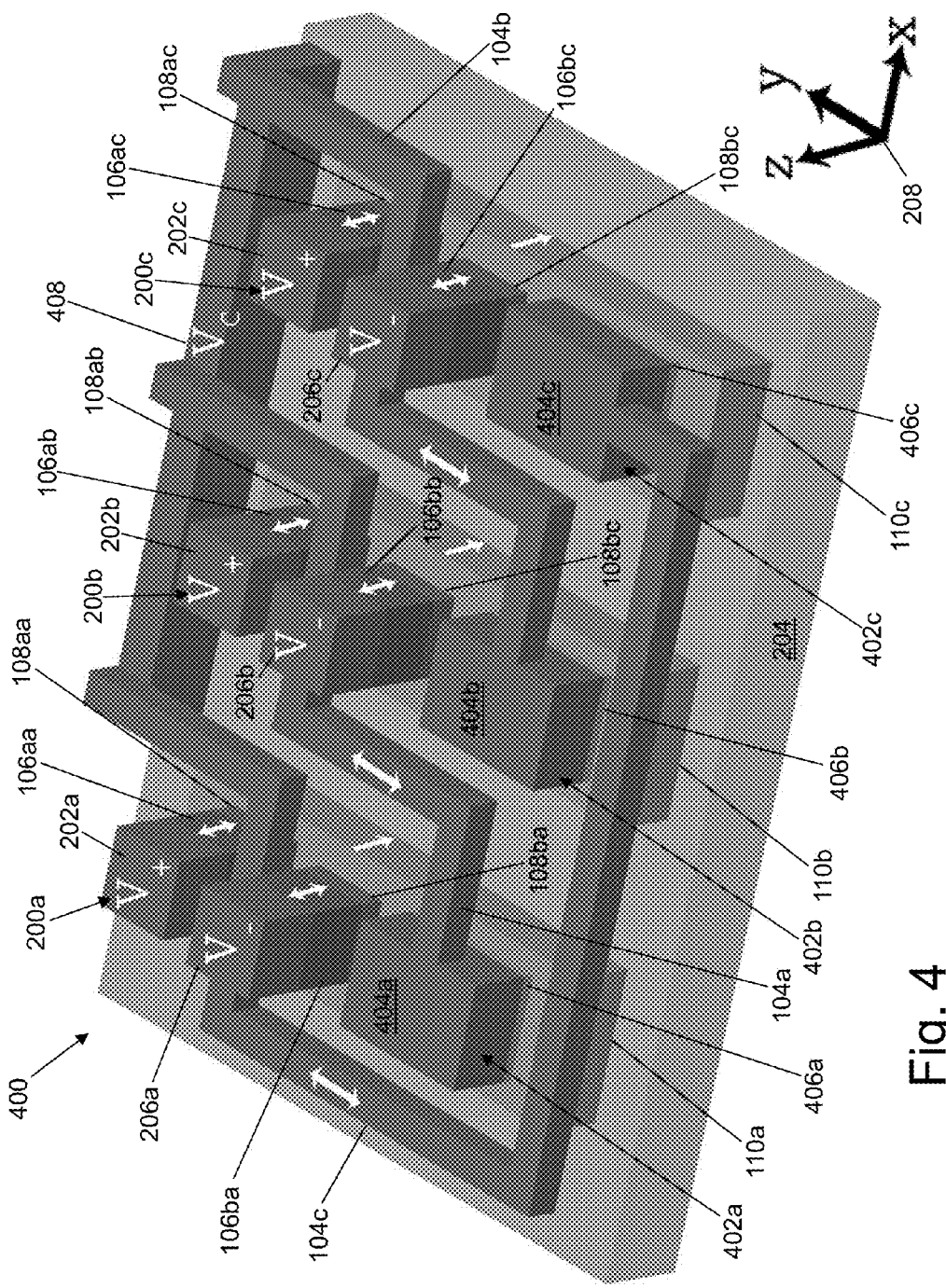
FIG. 4 depicts a schematic perspective view of a ring oscillator formed using the magnetic tunnel junction device of FIG. 1 in accordance with an illustrative embodiment.

As an example, with reference to FIG. 4, a schematic perspective view of a ring oscillator device 400 is shown in accordance with an illustrative embodiment. ring oscillator device 400 may include a first inverter device 200a, a second inverter device 200b, a third inverter device 200c, a first capacitor 402a, a second capacitor 402b, a third capacitor 402c, and an reference conductor 408.

First inverter device 200a is similar to inverter device 200 and may include a third top ferromagnet layer 106aa, a third tunneling layer 108aa, a fourth top ferromagnet layer 106ba, a fourth tunneling layer 108ba, a first bottom ferromagnet layer 110a, a third electrode 202a, a fourth electrode 206a, and a first control wire 104a. Second inverter device 200b is similar to inverter device 200 and may include an fifth top ferromagnet layer 106ab, a fifth tunneling layer 108ab, a sixth top ferromagnet layer 106bb, a sixth tunneling layer 108bb, a second bottom ferromagnet layer 110b, a fifth electrode 202b, a sixth electrode 206b, and a second control wire 104b. Third inverter device 200c is similar to inverter device 200 and may include an seventh top ferromagnet layer 106ac, a seventh tunneling layer 108ac, a eighth top ferromagnet layer 106bc, a eighth tunneling layer 108bc, a third bottom ferromagnet layer 110c, a seventh electrode 202c, an eighth electrode 206c, and a third control wire 104c. First bottom ferromagnet layer 110a, second bottom ferromagnet layer 110b, and third bottom ferromagnet layer 110c are formed on substrate 204.

Third top ferromagnet layer 106aa, fourth top ferromagnet layer 106ba, fifth top ferromagnet layer 106ab, sixth top ferromagnet layer 106bb, seventh top ferromagnet layer 106ac, and eighth top ferromagnet layer 106bc are similar to top ferromagnet layer 106 described with reference to MTJ element 102. Third tunneling layer 108aa, fourth tunneling layer 108ba, fifth tunneling layer 108ab, sixth tunneling layer 108bb, seventh tunneling layer 108ac, and eighth tunneling layer 108bc are similar to tunneling layer 108 described with reference to MTJ element 102. First bottom ferromagnet layer 110a, second bottom ferromagnet layer 110b, and third bottom ferromagnet layer 110c are similar to bottom ferromagnet layer 110 described with reference to MTJ element 102.

Third tunneling layer 108aa is formed between third top ferromagnet layer 106aa and first bottom ferromagnet layer 110a. Fourth tunneling layer 108ba is formed between fourth top ferromagnet layer 106ba and first bottom ferromagnet layer 110a. Fifth tunneling layer 108ab is formed between fifth top ferromagnet layer 106ab and second bottom ferromagnet layer 110b. Sixth tunneling layer 108bb is formed between sixth top ferromagnet layer 106bb and second bottom ferromagnet layer 110b. Seventh tunneling layer 108ac is formed between seventh top ferromagnet layer 106ac and third bottom ferromagnet layer 110c. Eighth tunneling layer 108bc is formed between eighth top ferromagnet layer 106bc and third bottom ferromagnet layer 110c.

Third electrode 202a, fourth electrode 206a, fifth electrode 202b, sixth electrode 206b, seventh electrode 202c, and eighth electrode 206c are formed of a conductive material such as a metal. Third electrode 202a, fifth electrode 202b, and seventh electrode 202c are similar to first electrode 202 and mounted on third top ferromagnet layer 106aa, fifth top ferromagnet layer 106ab, and seventh top ferromagnet layer 106ac, respectively. Fourth electrode 206a, sixth electrode 206b, and eighth electrode 206c are similar to second electrode 206 and mounted on fourth top ferromagnet layer 106ba, sixth top ferromagnet layer 106bb, and eighth top ferromagnet layer 106bc, respectively. The first electric potential is applied to third electrode 202a, fifth electrode 202b, and seventh electrode 202c. The second electric potential is applied to fourth electrode 206a, sixth electrode 206b, and eighth electrode 206c.

First capacitor 402a may include a first conductive layer 404a and a first dielectric layer 406a. First dielectric layer 406a is formed of a dielectric material mounted on first bottom ferromagnet layer 110a. First conductive layer 404a is mounted on first dielectric layer 406a such that first dielectric layer 406a is mounted between first conductive layer 404a and first bottom ferromagnet layer 110a.

Second capacitor 402b may include a second conductive layer 404b and a second dielectric layer 406b. Second dielectric layer 406b is formed of a dielectric material mounted on second bottom ferromagnet layer 110b. Second conductive layer 404b is mounted on second dielectric layer 406b such that second dielectric layer 406b is mounted between second conductive layer 404b and second bottom ferromagnet layer 110b.

Third capacitor 402c may include a third conductive layer 404c and a third dielectric layer 406c. Third dielectric layer 406c is formed of a dielectric material mounted on third bottom ferromagnet layer 110c. Third conductive layer 404c is mounted on third dielectric layer 406c such that third dielectric layer 406c is mounted between third conductive layer 404a and third bottom ferromagnet layer 110c.

First control wire 104a is connected between first conductive layer 404a and reference conductor 408. Second control wire 104b is connected between second conductive layer 404b and reference conductor 408. Third control wire 104c is connected between third conductive layer 404c and reference conductor 408. A third electric potential is applied to reference conductor 408. For illustration, the first electric potential>the third electric potential>the second electric potential. However, there are no constraints on the relationships between the first electric potential, the third electric potential, and the second electric potential because the electric potentials can be selected to achieve a specific circuit behavior as understood by a person of skill in the art.

Again, the magnetization of the "hard" magnetic material used to form first bottom ferromagnet layer 110a, second bottom ferromagnet layer 110b, and third bottom ferromagnet layer 110c is constant and in a −z direction.

The magnetization of the "soft" magnetic material used to form third top ferromagnet layer 106aa and fourth top ferromagnet layer 106ba is selectable between a ±z direction based on application of a current through third control wire 104c. Third control wire 104c is positioned sufficiently close to third top ferromagnet layer 106aa and to fourth top ferromagnet layer 106ba to switch the magnetization direction of third top ferromagnet layer 106aa and of fourth top ferromagnet layer 106ba when a charge pulse flows through third control wire 104c.

The magnetization of the "soft" magnetic material used to form fifth top ferromagnet layer 106ab and sixth top ferromagnet layer 106bb is selectable between a ±z direction based on application of a current through first control wire 104a. First control wire 104a is positioned sufficiently close to fifth top ferromagnet layer 106ab and to sixth top ferromagnet layer 106bb to switch the magnetization direction of fifth top ferromagnet layer 106ab and of sixth top ferromagnet layer 106bb when a charge pulse flows through first control wire 104a.

The magnetization of the "soft" magnetic material used to form seventh top ferromagnet layer 106ac and eighth top ferromagnet layer 106bc is selectable between a ±z direction based on application of a current through second control wire 104b. Second control wire 104b is positioned sufficiently close to seventh top ferromagnet layer 106ac and to eighth top ferromagnet layer 106bc to switch the magnetization direction of seventh top ferromagnet layer 106ac and of eighth top ferromagnet layer 106bc when a charge pulse flows through second control wire 104b.

Whenever the voltage on first conductive layer 404a switches, a charge pulse flows through first control wire 104a. The charge pulse flowing through first control wire 104a results in switching of the magnetization of fifth top ferromagnet layer 106ab and sixth top ferromagnet layer 106bb, causing the voltage on second conductive layer 404b to switch. When the voltage on second conductive layer 404b switches, a charge pulse flows through second control wire 104b. The charge pulse flowing through second control wire 104b results in switching of the magnetization of seventh top ferromagnet layer 106ac and eighth top ferromagnet layer 106bc, causing the voltage on third conductive layer 404c to switch. When the voltage on third conductive layer 404c switches, a charge pulse flows through third control wire 104c. The charge pulse flowing through third control wire 104c results in switching of the magnetization of third top ferromagnet layer 106aa and fourth top ferromagnet layer 106ba, causing the voltage on first conductive layer 404a to switch. As a result, the signal propagates through ring oscillator device 400. This direct cascading scheme provides complementary inputs and outputs because the current can be routed across each inverter device 200a, 200b, 200c in either direction.

Figure 5:
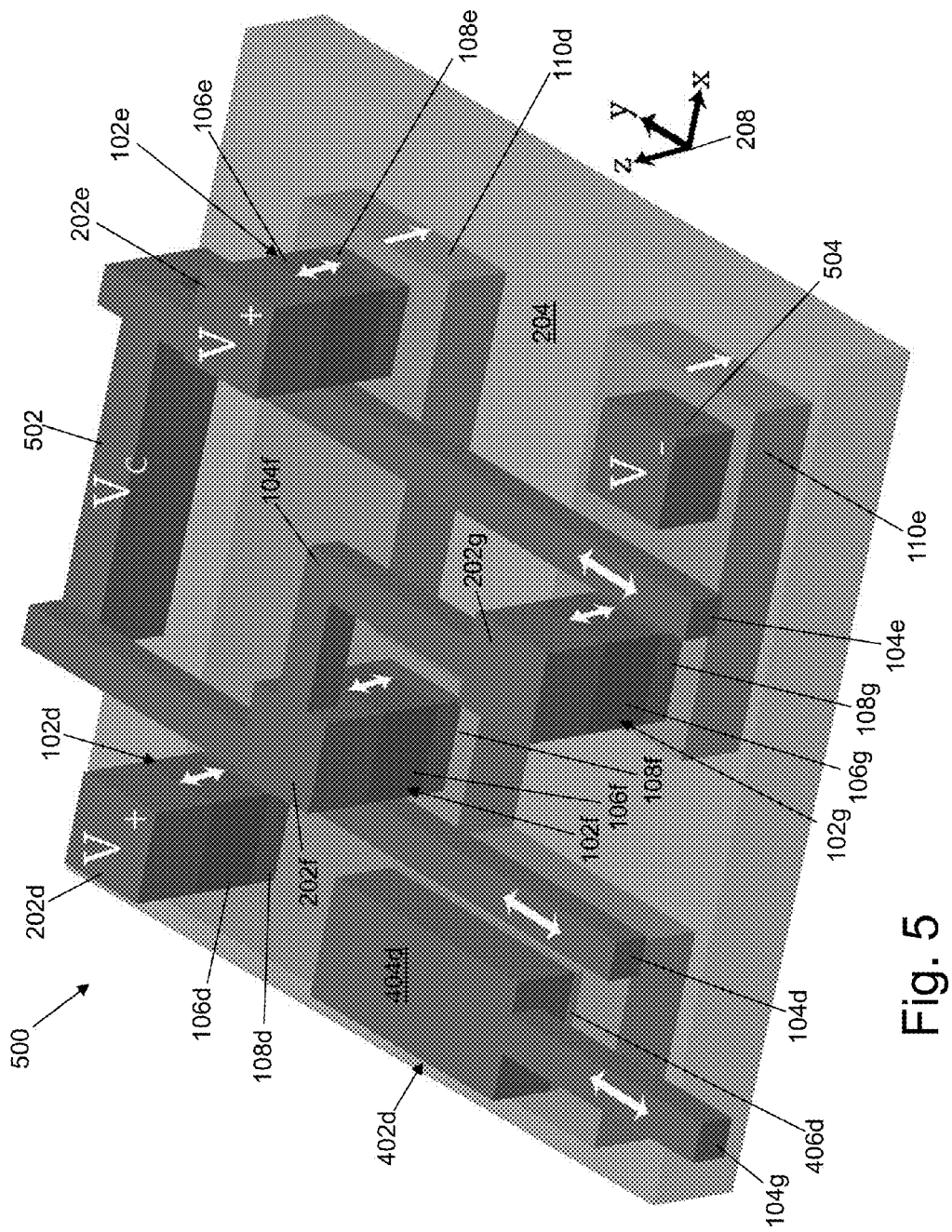
FIG. 5 depicts a schematic perspective view of an AND/OR/NAND/NOR gate formed using the magnetic tunnel junction device of FIG. 1 in accordance with an illustrative embodiment.

As another example, with reference to FIG. 5, a schematic perspective view of a logic gate 500 is shown in accordance with an illustrative embodiment. Logic gate 500 can be configured to perform logical AND, OR, NAND, NOR, etc. operations. Logic gate 500 may include a third MTJ element 102d, a fourth MTJ element 102e, a fifth MTJ element 102f, a sixth MTJ element 102g, a seventh electrode 202d, an eighth electrode 202e, a ninth electrode 202f, a tenth electrode 202g, a fourth capacitor 402d, substrate 204, a second reference conductor 502, and a third reference conductor 504. For illustration, third MTJ element 102d, fourth MTJ element 102e, fifth MTJ element 102f, and sixth MTJ element 102g are shown offset in the y-direction though this arrangement is merely for visual clarity.

Third MTJ element 102d may include a ninth top ferromagnet layer 106d, a ninth tunneling layer 108d, and a fourth bottom ferromagnet layer 110d. Seventh electrode 202d is similar to first electrode 202 and is mounted on ninth top ferromagnet layer 106d.

Fourth MTJ element 102e may include a tenth top ferromagnet layer 106e, a tenth tunneling layer 108e, and fourth bottom ferromagnet layer 110d. Eighth electrode 202e is similar to first electrode 202 and is mounted on tenth top ferromagnet layer 106e.

Fifth MTJ element 102f may include a eleventh top ferromagnet layer 106f, a eleventh tunneling layer 108f, and fourth bottom ferromagnet layer 110d. Ninth electrode 202d is similar to first electrode 202 and is mounted on eleventh top ferromagnet layer 106f.

Sixth MTJ element 102g may include an twelfth top ferromagnet layer 106g, a twelfth tunneling layer 108g, and a fifth bottom ferromagnet layer 110e. Tenth electrode 202g is similar to first electrode 202 and is mounted on twelfth top ferromagnet layer 106g. Fourth bottom ferromagnet layer 110d and fifth bottom ferromagnet layer 110e are formed on substrate 204.

Ninth top ferromagnet layer 106d, tenth top ferromagnet layer 106e, eleventh top ferromagnet layer 106f, and twelfth top ferromagnet layer 106g are similar to top ferromagnet layer 106 described with reference to MTJ element 102. Ninth tunneling layer 108d, tenth tunneling layer 108e, eleventh tunneling layer 108f, and twelfth tunneling layer 108g are similar to tunneling layer 108 described with reference to MTJ element 102. Ninth tunneling layer 108d is formed between ninth top ferromagnet layer 106d and fourth bottom ferromagnet layer 110d. Tenth tunneling layer 108e is formed between tenth top ferromagnet layer 106e and fourth bottom ferromagnet layer 110d. Eleventh tunneling layer 108f is formed between eleventh top ferromagnet layer 106f and fourth bottom ferromagnet layer 110d. Twelfth tunneling layer 108g is formed between twelfth top ferromagnet layer 106g and fifth bottom ferromagnet layer 110e.

Fourth capacitor 402d may include a fourth conductive layer 404d and a fourth dielectric layer 406d. Fourth dielectric layer 406d is formed of a dielectric material mounted on fourth bottom ferromagnet layer 110d. Fourth conductive layer 404d is mounted on fourth dielectric layer 406d such that fourth dielectric layer 406d is mounted between fourth conductive layer 404d and fourth bottom ferromagnet layer 110d.

A fourth control wire 104d is connected between a first input (not shown) and second reference conductor 502. A fifth control wire 104e is connected between a second input (not shown) and second reference conductor 502. A sixth control wire 104f is connected between ninth electrode 202f and tenth electrode 202g. A seventh control wire 104g is mounted between fourth conductive layer 404d and an output (not shown). The first electric potential, $V^+$, is applied to seventh electrode 202d and eighth electrode 202e. The third electric potential, $V_c$, is applied to second reference conductor 502. The second electric potential, $V^-$, is applied to third reference conductor 504.

Again, the magnetization of the "hard" magnetic material used to form fourth bottom ferromagnet layer 110d and fifth bottom ferromagnet layer 110e is constant and in a −z direction.

The magnetization of the "soft" magnetic material used to form ninth top ferromagnet layer 106d and eleventh top ferromagnet layer 106f is selectable between a ±z direction based on application of a current through fourth control wire 104d. Fourth control wire 104d is positioned sufficiently close to ninth top ferromagnet layer 106d and to eleventh top ferromagnet layer 106f to switch the magnetization direction of ninth top ferromagnet layer 106d and of eleventh top ferromagnet layer 106f when a charge pulse flows through fourth control wire 104d.

The magnetization of the "soft" magnetic material used to form tenth top ferromagnet layer 106e and twelfth top ferromagnet layer 106g is selectable between a ±z direction based on application of a current through fifth control wire 104e. Fifth control wire 104e is positioned sufficiently close to tenth top ferromagnet layer 106e and to twelfth top ferromagnet layer 106g to switch the magnetization direction of tenth top ferromagnet layer 106e and of twelfth top ferromagnet layer 106g when a charge pulse flows through fifth control wire 104e.

Logic gate 500 can be configured to perform logical AND, OR, NAND, and/or NOR operations. For example, to perform logical a logical AND operation, an input current applied through fourth control wire 104d in the +y direction and through fifth control wire 104e in the −y direction and an output current received through seventh control wire 104g in the +y direction can be considered a logical "1". Table I below shows the input current state on fourth control wire 104d and fifth control wire 104e, the state of each of third MTJ element 102d, fourth MTJ element 102e, fifth MTJ element 102f, and sixth MTJ element 102g, and the output voltage and current state on seventh control wire 104g. An "On" state indicates the respective ferromagnet layers are in parallel orientation, and an "Off" state indicates the respective ferromagnet layers are in antiparallel orientation.

TABLE I

| 104d | 104e | 102d | 102f | 102g | 102e | V 104g | I 104g |
|------|------|------|------|------|------|--------|--------|
| 0 | 0 | On | Off | Off | On | V+ | 0 |
| 0 | 1 | On | Off | On | Off | V+ | 0 |
| 1 | 0 | Off | On | Off | On | V+ | 0 |
| 1 | 1 | Off | On | On | Off | V− | 1 |

To perform a logical OR operation, an input current applied through fourth control wire 104d in the −y direction and through fifth control wire 104e in the +y direction and an output current received through seventh control wire 104g in the −y direction can be considered a logical "1". Table II below shows the input current state on fourth control wire 104d and fifth control wire 104e, the state of each of third MTJ element 102d, fourth MTJ element 102e, fifth MTJ element 102f, and sixth MTJ element 102g, and the output voltage and current state on seventh control wire 104g.

TABLE II

| 104d | 104e | 102d | 102f | 102g | 102e | V 104g | I 104g |
|------|------|------|------|------|------|--------|--------|
| 0 | 0 | Off | On | On | Off | V− | 0 |
| 0 | 1 | Off | On | Off | On | V+ | 1 |
| 1 | 0 | On | Off | On | Off | V+ | 1 |
| 1 | 1 | On | Of | Off | On | V+ | 1 |

To perform a logical NOR operation, an input current applied through fourth control wire 104d in the −y direction and through fifth control wire 104e in the +y direction and an output current received through seventh control wire 104g in the +y direction can be considered a logical "1". Table II below shows the input current state on fourth control wire 104d and fifth control wire 104e, the state of each of third MTJ element 102d, fourth MTJ element 102e, fifth MTJ element 102f, and sixth MTJ element 102g, and the output voltage and current state on seventh control wire 104g.

TABLE III

| 104d | 104e | 102d | 102f | 102g | 102e | V 104g | I 104g |
|------|------|------|------|------|------|--------|--------|
| 0 | 0 | Off | On | On | Off | V− | 1 |
| 0 | 1 | Off | On | Off | On | V+ | 0 |
| 1 | 0 | On | Off | On | Off | V+ | 0 |
| 1 | 1 | On | Of | Off | On | V+ | 0 |

To perform a logical NAND operation, an input current applied through fourth control wire 104d in the −y direction and through fifth control wire 104e in the +y direction and an output current received through seventh control wire 104g in the +y direction can be considered a logical "1". Table II below shows the input current state on fourth control wire 104d and fifth control wire 104e, the state of each of third MTJ element 102d, fourth MTJ element 102e, fifth MTJ element 102f, and sixth MTJ element 102g, and the output voltage and current state on seventh control wire 104g.

TABLE IV

| 104d | 104e | 102d | 102f | 102g | 102e | V 104g | I 104g |
|------|------|------|------|------|------|--------|--------|
| 0 | 0 | On | Off | Off | On | V+ | 0 |
| 0 | 1 | On | Off | On | Off | V+ | 0 |
| 1 | 0 | Off | On | Off | On | V+ | 0 |
| 1 | 1 | Off | On | On | Off | V− | 1 |

Logic gate 500 can be configured to perform any two-input AND or OR function with any combination of polarities through appropriate interpretation of the current direction for the inputs and the output.

Figure 6:
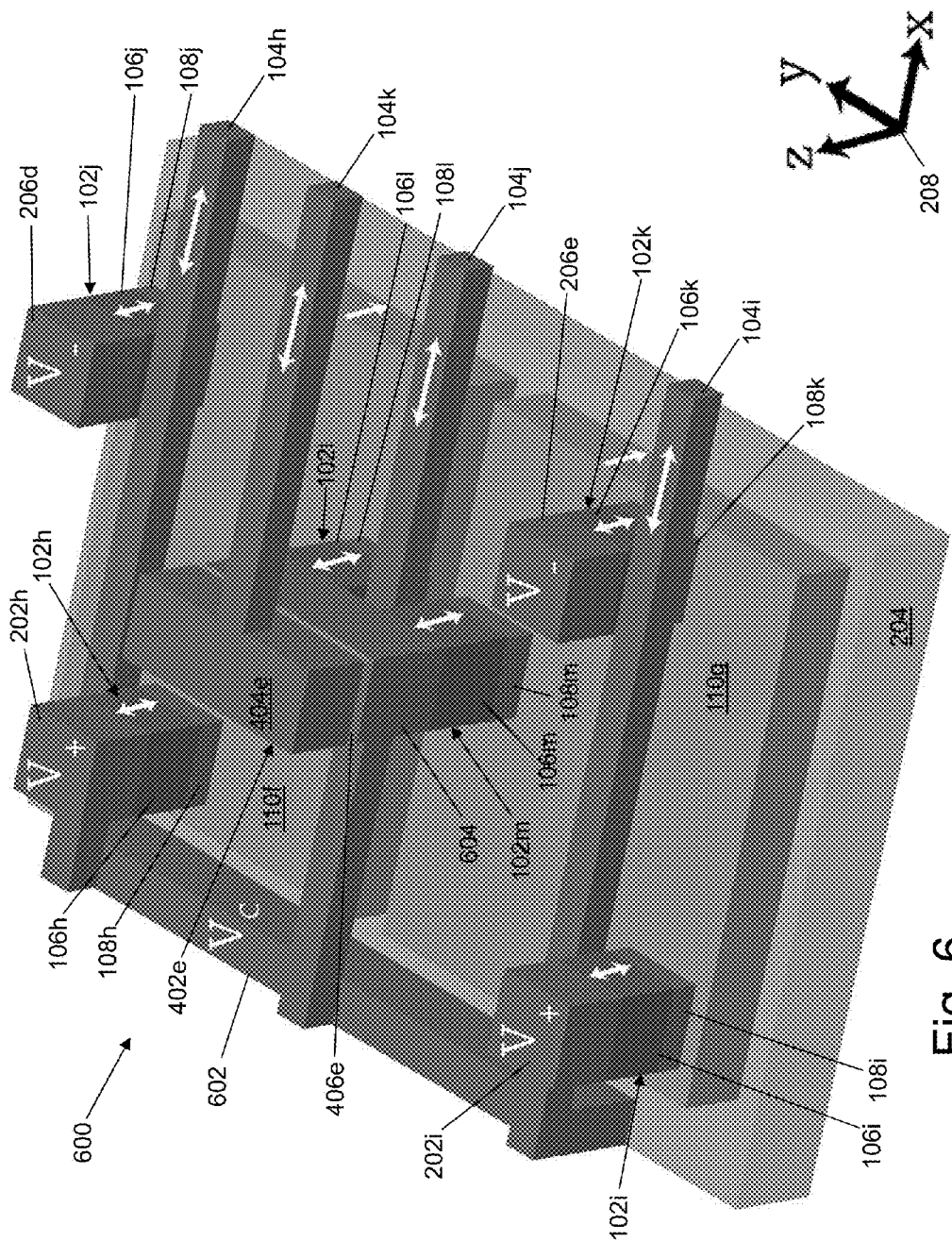
FIG. 6 depicts a schematic perspective view of a two-to-one multiplexer formed using the magnetic tunnel junction device of FIG. 1 in accordance with an illustrative embodiment.

As another example, with reference to FIG. 6, a schematic perspective view of a multiplexer 600 is shown in accordance with an illustrative embodiment. Multiplexer 600 may include a seventh MTJ element 102h, an eighth MTJ element 102i, a ninth MTJ element 102j, a tenth MTJ element 102k, an eleventh MTJ element 102l, a twelfth MTJ element 102m, an eleventh electrode 202h, a twelfth electrode 202i, a thirteenth electrode 206d, a fourteenth electrode 206e, a fifth capacitor 402e, substrate 204, a fourth reference conductor 602, and a conductor 604. For illustration, seventh MTJ element 102h, eighth MTJ element 102i, ninth MTJ element 102j, tenth MTJ element 102k, eleventh MTJ element 102l, and twelfth MTJ element 102m are shown offset in the x-direction though this arrangement is merely for visual clarity.

Seventh MTJ element 102h may include a thirteenth top ferromagnet layer 106h, a thirteenth tunneling layer 108h, and a sixth bottom ferromagnet layer 110f. Eleventh electrode 202h is similar to first electrode 202 and is mounted on thirteenth top ferromagnet layer 106h. The first electric potential, V+, is applied to eleventh electrode 202h.

Eighth MTJ element 102i may include a fourteenth top ferromagnet layer 106i, a fourteenth tunneling layer 108h, and a seventh bottom ferromagnet layer 110g. Twelfth electrode 202i is similar to first electrode 202 and is mounted on fourteenth top ferromagnet layer 106i. The first electric potential, V⁺, is applied to twelfth electrode 202i.

Ninth MTJ element 102j may include a fifteenth top ferromagnet layer 106j, a fifteenth tunneling layer 108j, and sixth bottom ferromagnet layer 110f. Thirteenth electrode 206d is similar to second electrode 206 and is mounted on fifteenth top ferromagnet layer 106j. The second electric potential, V⁻, is applied to thirteenth electrode 206d.

Tenth MTJ element 102k may include a sixteenth top ferromagnet layer 106k, a sixteenth tunneling layer 108k, and seventh bottom ferromagnet layer 110g. Fourteenth electrode 206e is similar to second electrode 206 and is mounted on sixteenth top ferromagnet layer 106k. The second electric potential, V⁻, is applied to fourteenth electrode 206e.

Eleventh MTJ element 102l may include a seventeenth top ferromagnet layer 106l, a seventeenth tunneling layer 108l, and sixth bottom ferromagnet layer 110f. Conductor 604 is mounted on seventeenth top ferromagnet layer 106l.

Twelfth MTJ element 102m may include a eighteenth top ferromagnet layer 106m, a eighteenth tunneling layer 108m, and seventh bottom ferromagnet layer 110g. Conductor 604 is mounted on eighteenth top ferromagnet layer 106m.

Fifth capacitor 402e may include a fifth conductive layer 404e and a fifth dielectric layer 406e. Fifth dielectric layer 406e is formed of a dielectric material mounted on conductor 604. Fifth conductive layer 404e is mounted on fifth dielectric layer 406e such that fifth dielectric layer 406e is mounted between fifth conductive layer 404e and conductor 604.

An eighth control wire 104h is connected between a first input (not shown) and fourth reference conductor 602. A ninth control wire 104i is connected between a second input (not shown) and fourth reference conductor 602. A tenth control wire 104j is connected between a third input (not shown) and fourth reference conductor 602. An eleventh control wire 104k is mounted between fifth conductive layer 404e and an output (not shown). The third electric potential, V_c, is applied to fourth reference conductor 602.

Again, the magnetization of the "hard" magnetic material used to form sixth bottom ferromagnet layer 110f and seventh bottom ferromagnet layer 110g is constant and in a –z direction.

The magnetization of the "soft" magnetic material used to form thirteenth top ferromagnet layer 106h and fifteenth top ferromagnet layer 106j is selectable between a ±z direction based on application of a current through eighth control wire 104h. Eighth control wire 104h is positioned sufficiently close to thirteenth top ferromagnet layer 106h and to fifteenth top ferromagnet layer 106j to switch the magnetization direction of thirteenth top ferromagnet layer 106h and of fifteenth top ferromagnet layer 106j when a charge pulse flows through eighth control wire 104h.

The magnetization of the "soft" magnetic material used to form fourteenth top ferromagnet layer 106i and sixteenth top ferromagnet layer 106k is selectable between a ±z direction based on application of a current through ninth control wire 104i. Ninth control wire 104i is positioned sufficiently close to fourteenth top ferromagnet layer 106i and to sixteenth top ferromagnet layer 106k to switch the magnetization direction of fourteenth top ferromagnet layer 106i and of sixteenth top ferromagnet layer 106k when a charge pulse flows through ninth control wire 104i.

The magnetization of the "soft" magnetic material used to form seventeenth top ferromagnet layer 106l and eighteenth top ferromagnet layer 106m is selectable between a ±z direction based on application of a current through tenth control wire 104j. Tenth control wire 104j is positioned sufficiently close to seventeenth top ferromagnet layer 106l and to eighteenth top ferromagnet layer 106m to switch the magnetization direction of seventeenth top ferromagnet layer 106l and of eighteenth top ferromagnet layer 106m when a charge pulse flows through tenth control wire 104j.

Multiplexer 600 can be configured to perform a two-to-one multiplexing operation. An input current applied through eighth control wire 104h, ninth control wire 104i, and tenth control wire 104j in the +x direction and an output current received through eleventh control wire 104k in the +x direction can be considered a logical "1". Table V below shows the input current state on eighth control wire 104h, ninth control wire 104i, and tenth control wire 104j, the state of each of MTJ element 102h, 102i, 102j, 102k, 102l, 102l, and the output voltage and current state on eleventh control wire 104k. An "on" state indicates the respective ferromagnet layers are in parallel orientation, and an "off" state indicates the respective ferromagnet layers are in antiparallel orientation.

TABLE V

| 104j | 104h | 104i | 102l | 102m | 102h | 102j | 102i | 102k | V 104k | I 104k |
|---|---|---|---|---|---|---|---|---|---|---|
| 0 | 0 | 0 | on | off | off | on | off | on | V⁻ | 0 |
| 0 | 0 | 1 | on | off | off | on | on | off | V⁻ | 0 |
| 0 | 1 | 0 | on | off | on | off | off | on | V⁺ | 1 |
| 0 | 1 | 1 | on | off | on | off | on | off | V⁺ | 1 |
| 1 | 0 | 0 | off | on | off | on | off | on | V⁻ | 0 |
| 1 | 0 | 1 | off | on | off | on | on | off | V⁺ | 1 |
| 1 | 1 | 0 | off | on | on | off | off | on | V⁻ | 0 |
| 1 | 1 | 1 | off | on | on | off | on | off | V⁺ | 1 |

A doubling in logical efficiency is achieved using multiplexer 600 as compared to fully complementary CMOS. Coupled with the increased switching efficiency available with spintronic techniques, the logical efficiency of multiplexer 600 provides improved power, performance, and area.

Any logic function can be performed using one or more MTJ device 100 with an equal number or fewer devices and stages than with CMOS. The increased logical efficiency using one or more MTJ device 100 as compared to fully complementary CMOS can be seen in FIG. 7. This new logic family has significant implications on the circuit design process. In terms of physical layout, logic gate 500 allows for increased reliance on standard cells. Additionally, the flexibility in cascading polarization opens up new opportunities and challenges for wire routing.

As used in this disclosure, the term "mount" includes join, unite, connect, couple, associate, insert, hang, hold, affix, attach, fasten, bind, paste, secure, bolt, screw, rivet, pin, nail, clasp, clamp, cement, fuse, solder, weld, glue, form over, form on, slide together, layer, deposit, sputter, and other like terms. The phrases "mounted on" and "mounted to" include any interior or exterior portion of the element referenced. These phrases also encompass direct mounting (in which the referenced elements are in direct contact) and indirect mounting (in which the referenced elements are not in direct contact, but are mounted together via intermediate elements). Elements referenced as mounted to each other herein may further be integrally formed together, for example, using a molding process as understood by a person of skill in the art. As a result, elements described herein as being mounted to each other need not be discrete structural elements. The elements may be mounted permanently, removably, or releasably.

The use of directional terms, such as top, bottom, right, left, front, back, up, down, etc. are merely intended to facilitate reference to the various surfaces of the described structures relative to the orientations shown in the drawings and are not intended to be limiting. The use of the terms "first", "second", "third", etc. are merely used to distinguish one element from another and are not intended to be limiting.

The dimensions provided herein are illustrative as one skilled in the art could deviate from these dimensions and obtain similar results. The word "illustrative" is used herein to mean serving as an illustrative, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, using "and" or "or" in the detailed description is intended to include "and/or" unless specifically indicated otherwise. The illustrative embodiments may be implemented as a method, apparatus, or article of manufacture.

It will be understood that many additional changes in the details, materials, steps and arrangement of parts, which have been herein described and illustrated to explain the nature of the invention, may be made by those skilled in the art within the principle and scope of the invention as expressed in the appended claims. The foregoing description of illustrative embodiments of the disclosed subject matter has been presented for purposes of illustration and of description. It is not intended to be exhaustive or to limit the disclosed subject matter to the precise form disclosed, and modifications and variations are possible in light of the above teachings or may be acquired from practice of the disclosed subject matter. The embodiments were chosen and described in order to explain the principles of the disclosed subject matter and as practical applications of the disclosed subject matter to enable one skilled in the art to utilize the disclosed subject matter in various embodiments and with various modifications as suited to the particular use contemplated. It is intended that the scope of the disclosed subject matter be defined by the claims appended hereto and their equivalents.

What is claimed is:

1. A magnetic tunnel junction device comprising:
   a first magnetic tunnel junction (MTJ) element comprising
   a first top ferromagnet layer formed of a first magnetic material;
   a first tunneling layer; and
   a bottom ferromagnet layer formed of a second magnetic material, wherein the first tunneling layer is mounted between the first top ferromagnet layer and the bottom ferromagnet layer;
   a second MTJ element comprising;
   a second top ferromagnet layer formed of a third magnetic material;
   a second tunneling layer; and
   the bottom ferromagnet layer, wherein the second tunneling layer is mounted between the second top ferromagnet layer and the bottom ferromagnet layer; and
   a single control wire configured to conduct a charge pulse to generate a magnetic field, wherein a direction of charge flow in the single control wire extends substantially perpendicular to a magnetization direction of the first top ferromagnet layer and of the second top ferromagnet layer, wherein the direction of charge flow in the single control wire extends between the first top ferromagnet layer and the second top ferromagnet layer, wherein the single control wire is positioned sufficiently close to the first top ferromagnet layer and to the second top ferromagnet layer to reverse the magnetization direction of the first top ferromagnet layer and of the second top ferromagnet layer solely via the magnetic field when the charge pulse flows therethrough while not reversing the magnetization direction of the bottom ferromagnet layer via the magnetic field when the charge pulse flows therethrough,
   wherein the first MTJ element has a first side surface extending perpendicular to a first plane defined by the first top ferromagnet layer, further wherein the second MTJ element has a second side surface extending perpendicular to a second plane defined by the second top ferromagnet layer and facing towards the first side surface, and further wherein the single control wire extends between the first and second side surfaces and alongside the first and second side surfaces.

2. The magnetic tunnel junction device of claim 1, wherein the first magnetic material and the second magnetic material are the same material.

3. The magnetic tunnel junction device of claim 1, wherein the first magnetic material and the second magnetic material are different materials selected such that the single control wire positioned sufficiently close to the top ferromagnet layer reverses the magnetization direction of the top ferromagnet layer when the charge pulse flows therethrough.

4. The magnetic tunnel junction device of claim 1, wherein the direction of charge flow can be reversed.

5. The magnetic tunnel junction device of claim 4, wherein, when the direction of charge flow is reversed, the magnetization direction of the top ferromagnet layer is reversed.

6. The magnetic tunnel junction device of claim 5, wherein, when the direction of charge flow is reversed, a magnetization direction of the bottom ferromagnet layer is not reversed.

7. The magnetic tunnel junction device of claim 1, further comprising:
   a dielectric layer mounted on the bottom ferromagnet layer;
   a conducting layer mounted on the dielectric layer opposite the bottom ferromagnet layer; and
   a second control wire electrically coupled to the conducting layer and configured to conduct a second charge pulse to generate a second magnetic field.

8. The magnetic tunnel junction device of claim 7, further comprising:
   a third MTJ element comprising
   a third top ferromagnet layer formed of a fourth magnetic material;
   a third tunneling layer; and
   a second bottom ferromagnet layer formed of a fifth magnetic material, wherein the third tunneling layer is mounted between the third top ferromagnet layer and the second bottom ferromagnet layer; and
   a fourth MTJ element comprising;
   a fourth top ferromagnet layer formed of a sixth magnetic material;
   a fourth tunneling layer; and the second bottom ferromagnet layer, wherein the fourth tunneling layer is mounted between the fourth top ferromagnet layer and the second bottom ferromagnet layer;
wherein a direction of charge flow in the second control wire extends substantially perpendicular to a magnetization direction of the third top ferromagnet layer and of the fourth top ferromagnet layer, wherein the direction of charge flow in the second control wire extends between the third top ferromagnet layer and the fourth top ferromagnet layer, wherein the second control wire is positioned sufficiently close to the third top ferromagnet layer and to the fourth top ferromagnet layer to reverse the magnetization direction of the third top ferromagnet layer and of the fourth top ferromagnet layer via the second magnetic field when the second charge pulse flows therethrough while not reversing the magnetization direction of the second bottom ferromagnet layer via the second magnetic field when the charge pulse flows therethrough.

9. The magnetic tunnel junction device of claim 8, further comprising:
a second dielectric layer mounted on the second bottom ferromagnet layer; and
a second conducting layer mounted on the second dielectric layer opposite the second bottom ferromagnet layer;
wherein the single control wire is electrically coupled to the second conducting layer.

10. The magnetic tunnel junction device of claim 1, wherein the first magnetic material and the third magnetic material are the same material.

11. The magnetic tunnel junction device of claim 1, further comprising:
a first electrode mounted on a side of the first top ferromagnet layer opposite the first tunneling layer; and
a second electrode mounted on a side of the second top ferromagnet layer opposite the second tunneling layer;
wherein a first electric potential applied to the first electrode is greater than a second electric potential applied to the second electrode when the first electric potential is applied to the first electrode and the second electric potential is applied to the second electrode.

12. A magnetic tunnel junction device comprising:
a first magnetic tunnel junction (MTJ) element comprising
a first top ferromagnet layer formed of a first magnetic material;
a first tunneling layer; and
a bottom ferromagnet layer formed of a second magnetic material, wherein the first tunneling layer is mounted between the first top ferromagnet layer and the bottom ferromagnet layer;
a second MTJ element comprising;
a second top ferromagnet layer formed of a third magnetic material;
a second tunneling layer; and
the bottom ferromagnet layer, wherein the second tunneling layer is mounted between the second top ferromagnet layer and the bottom ferromagnet layer; and
a control wire configured to conduct a charge pulse to generate a magnetic field, wherein a direction of charge flow in the control wire extends substantially perpendicular to a magnetization direction of the first top ferromagnet layer and of the second top ferromagnet layer, wherein the direction of charge flow in the control wire extends between the first top ferromagnet layer and the second top ferromagnet layer, wherein the control wire is positioned sufficiently close to the first top ferromagnet layer and to the second top ferromagnet layer to reverse the magnetization direction of the first top ferromagnet layer and of the second top ferromagnet layer via the magnetic field when the charge pulse flows therethrough while not reversing the magnetization direction of the bottom ferromagnet layer via the magnetic field when the charge pulse flows therethrough, further comprising:
a third MTJ element comprising
a third top ferromagnet layer formed of a fourth magnetic material;
a third tunneling layer; and
the bottom ferromagnet layer, wherein the third tunneling layer is mounted between the third top ferromagnet layer and the bottom ferromagnet layer;
a fourth MTJ element comprising
a fourth top ferromagnet layer formed of a fifth magnetic material;
a fourth tunneling layer; and
a second bottom ferromagnet layer, wherein the fourth tunneling layer is mounted between the fourth top ferromagnet layer and the second bottom ferromagnet layer; and
a third control wire configured to conduct a third charge pulse to generate a third magnetic field, wherein a direction of charge flow in the third control wire extends substantially perpendicular to a magnetization direction of the third top ferromagnet layer and of the fourth top ferromagnet layer, wherein the direction of charge flow in the third control wire extends between the third top ferromagnet layer and the fourth top ferromagnet layer, wherein the third control wire is positioned sufficiently close to the third top ferromagnet layer and to the fourth top ferromagnet layer to reverse the magnetization direction of the third top ferromagnet layer and of the fourth top ferromagnet layer via the third magnetic field when the third charge pulse flows therethrough while not reversing the magnetization direction of the bottom ferromagnet layer or of the second bottom ferromagnet layer via the third magnetic field when the third charge pulse flows therethrough.

13. The magnetic tunnel junction device of claim 12, wherein the charge pulse defines a first logical input signal and the third charge pulse defines a second logical input signal.

14. The magnetic tunnel junction device of claim 13, further comprising:
a dielectric layer mounted on the bottom ferromagnet layer;
a conducting layer mounted on the dielectric layer opposite the bottom ferromagnet layer; and
a second control wire electrically coupled to the conducting layer and configured to conduct a second charge pulse.

15. The magnetic tunnel junction device of claim 14, wherein the second charge pulse defines a logical output signal determined based on the first logical input signal and the second logical input signal.

16. The magnetic tunnel junction device of claim 12, further comprising a reference conductor, wherein the control wire is electrically coupled to the reference conductor.

17. The magnetic tunnel junction device of claim 16, wherein the third control wire is electrically coupled to the reference conductor.

18. The magnetic tunnel junction device of claim 12, further comprising:
- a first electrode mounted on a side of the second top ferromagnet layer opposite the second tunneling layer; and
- a second electrode mounted on a side of the fourth top ferromagnet layer opposite the fourth tunneling layer, wherein a second control wire is electrically coupled between the first electrode and the second electrode.

19. A magnetic tunnel junction device comprising:
- a first magnetic tunnel junction (MTJ) element comprising
- a first top ferromagnet layer formed of a first magnetic material;
- a first tunneling layer; and
- a bottom ferromagnet layer formed of a second magnetic material, wherein the first tunneling layer is mounted between the first top ferromagnet layer and the bottom ferromagnet layer;
- a second MTJ element comprising;
- a second top ferromagnet layer formed of a third magnetic material;
- a second tunneling layer; and
- the bottom ferromagnet layer, wherein the second tunneling layer is mounted between the second top ferromagnet layer and the bottom ferromagnet layer; and
- a control wire configured to conduct a charge pulse to generate a magnetic field, wherein a direction of charge flow in the control wire extends substantially perpendicular to a magnetization direction of the first top ferromagnet layer and of the second top ferromagnet layer, wherein the direction of charge flow in the control wire extends between the first top ferromagnet layer and the second top ferromagnet layer, wherein the control wire is positioned sufficiently close to the first top ferromagnet layer and to the second top ferromagnet layer to reverse the magnetization direction of the first top ferromagnet layer and of the second top ferromagnet layer via the magnetic field when the charge pulse flows therethrough while not reversing the magnetization direction of the bottom ferromagnet layer via the magnetic field when the charge pulse flows therethrough, wherein the magnetic tunnel junction device further comprises:
- a third MTJ element comprising
- a third top ferromagnet layer formed of a fourth magnetic material;
- a third tunneling layer; and
- the bottom ferromagnet layer, wherein the third tunneling layer is mounted between the third top ferromagnet layer and the bottom ferromagnet layer;
- a fourth MTJ element comprising;
- a fourth top ferromagnet layer formed of a fifth magnetic material;
- a fourth tunneling layer; and
- a second bottom ferromagnet layer, wherein the fourth tunneling layer is mounted between the fourth top ferromagnet layer and the second bottom ferromagnet layer; and
- a third control wire configured to conduct a third charge pulse to generate a third magnetic field, wherein a direction of charge flow in the third control wire extends substantially perpendicular to a magnetization direction of the third top ferromagnet layer and of the fourth top ferromagnet layer, wherein the direction of charge flow in the third control wire extends between the third top ferromagnet layer and the fourth top ferromagnet layer, wherein the third control wire is positioned sufficiently close to the third top ferromagnet layer and to the fourth top ferromagnet layer to reverse the magnetization direction of the third top ferromagnet layer and of the fourth top ferromagnet layer via the third magnetic field when the third charge pulse flows therethrough while not reversing the magnetization direction of the bottom ferromagnet layer or of the second bottom ferromagnet layer via the third magnetic field when the third charge pulse flows therethrough, wherein the magnetic tunnel junction device further comprises a reference conductor, wherein the control wire is electrically coupled to the reference conductor, and wherein the third control wire is electrically coupled to the reference conductor, and wherein the magnetic tunnel junction device further comprises a second reference conductor mounted on the second bottom ferromagnet layer.

* * * * *